United States Patent
Hanson et al.

(10) Patent No.: US 6,872,612 B2
(45) Date of Patent: Mar. 29, 2005

(54) LOCAL INTERCONNECT FOR INTEGRATED CIRCUIT

(75) Inventors: Jeffrey F. Hanson, Portland, OR (US); Derryl D. J. Allman, Camas, WA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/383,149

(22) Filed: Mar. 6, 2003

(65) Prior Publication Data

US 2003/0146456 A1 Aug. 7, 2003

Related U.S. Application Data

(62) Division of application No. 09/892,832, filed on Jun. 27, 2001, now abandoned.

(51) Int. Cl.[7] .......................................... H01L 21/8238
(52) U.S. Cl. ...................... 438/199; 438/664; 438/682
(58) Field of Search .............................. 438/199, 299, 438/301, 303, 577, 630, 664, 682, 670, 951

(56) References Cited

U.S. PATENT DOCUMENTS 5,908,813 A * 6/1999 Givens ........................ 505/473
6,429,124 B1 * 8/2002 Tang et al. .................. 438/643
6,617,660 B2 * 9/2003 Murai et al. ................. 257/472
6,653,705 B2 * 11/2003 Ushijima et al. ............ 257/432

FOREIGN PATENT DOCUMENTS

JP          411284184 A   * 10/1999

* cited by examiner

*Primary Examiner*—Hoai Pham
(74) *Attorney, Agent, or Firm*—Luedeka, Neely & Graham

(57) ABSTRACT

An integrated circuit having a gate region, a source drain region, and an electrically nonconductive spacer separating the gate region and the source drain region. A local interconnect electrically connects the gate region to the source drain region across the electrically nonconductive spacer. The local interconnect is formed of a semiconducting material reacted with a metal. The local interconnect may be formed by implanting a precursor species into the electrically nonconductive spacer. A metal layer is deposited over at least the electrically nonconductive spacer, and the integrated circuit is heated to form an electrically conductive local interconnect from the metal layer and the precursor species implanted in the electrically nonconductive spacer.

5 Claims, 2 Drawing Sheets

LOCAL INTERCONNECT FOR INTEGRATED CIRCUIT

This is a divisional of application Ser. No. 09/892,832 filed Jun. 27, 2001, now abandoned.

FIELD

This invention relates to the field of integrated circuit fabrication. More particularly, this invention relates to local interconnects and processes for forming the local interconnects in an integrated circuit.

BACKGROUND

Typical metal oxide semiconductor transistors are formed with a gate region between doped active regions. The doped active regions are typically designated as a source region and a drain region. Because the source drain regions of the transistor are often formed to be identical, and because the source drain regions may switch during different operations between functioning as a source region and functioning as a drain region, the source drain regions are referred to collectively herein, rather than as either a separate source region or a separate drain region.

For metal oxide semiconductor types of devices, the source drain regions are typically electrically isolated from the gate region. This electrical isolation is often provided by an electrically nonconductive layer, such as an oxide. The electrically nonconductive layer typically underlies the gate region, and is often called a gate oxide. The gate region may also have electrically nonconductive spacers formed all around the circumference of the gate region. The electrically nonconductive spacers are also often formed of oxide, and thus are often referred to as spacer oxide. For the specific case in which the integrated circuit is formed in a silicon substrate, a silicon oxide, such as silicon dioxide, is often used to form the gate oxide and the spacer oxide.

In many applications, the source drain regions and the gate region of the transistor are not electrically connected one to another in near proximity to the transistor. In other words, two or more of the three elements may be electrically connected in some manner through other elements of the integrated circuit, but they are not directly electrically connected one to another, but rather are directly electrically connected to other elements within the integrated circuit.

However, in other applications it is desirable that two of the elements be directly electrically connected one to the other. For example, in many applications it is desirable that one of the source drain regions be directly electrically connected to the gate region. When one source drain region is directly electrically connected to the gate region of the same transistor, the electrical connection is called a local interconnect.

Current methods for forming local interconnects tend to require many processing steps. Additionally, local interconnects formed by current processes tend to be relatively large structures that may extend through several mask layers of the integrated circuit. What is needed, therefore, is an electrical interconnect structure for an integrated circuit, and a method for forming the electrical interconnect.

SUMMARY

The above and other needs are met by an integrated circuit having a gate region, a source drain region, and an electrically nonconductive spacer separating the gate region and the source drain region. A local interconnect electrically connects the gate region to the source drain region across the electrically nonconductive spacer. The local interconnect is formed of a semiconducting material reacted with a metal. In a preferred method according to the present invention, the local interconnect is formed by implanting a precursor species into the electrically nonconductive spacer. A metal layer is deposited over at least the electrically nonconductive spacer, and the integrated circuit is heated to form an electrically conductive local interconnect from the metal layer and the precursor species implanted in the electrically nonconductive spacer.

In various preferred embodiments, the precursor species is silicon and the metal layer is cobalt. Thus, in this preferred embodiment, the local interconnect is formed of a cobalt silicide, which forms across the electrically nonconductive spacer when the implanted silicon reacts with the cobalt. Thus, by implanting a reactive species within the electrically nonconductive spacer, an electrically conductive local interconnect can be easily formed during the same step as the salicides on the source drain regions and the gate region. In this manner, only a single additional masking step is required, for the implantation of the silicon into the electrically nonconductive oxide spacer. Further, the local interconnect formed in this manner is relatively thin as compared to other technologies, and does not impact other elements within the integrated circuit to the same degree as traditional local interconnect structures and methods.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
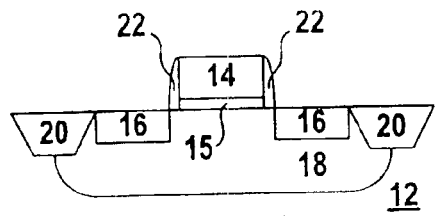
FIG. 1 is a cross-sectional side view of an integrated circuit after forming a electrically nonconductive spacer.

Referring now to FIG. 1, a method of forming the local interconnect across the electrically nonconductive spacer 22 is described, wherein the gate region 14 is electrically isolated from the source drain regions 16 by the electrically nonconductive spacer 22. It is appreciated that known processing methods are preferably used to fabricate the integrated circuit 12 to this point in the fabrication process. It is additionally appreciated that the description below focuses primarily on those aspects of the fabrication process that are new, and that there are other processing steps that accompany the steps describes below, but which are not recited here for the sake of clarity, and also so as to better highlight those steps of the preferred processes that are new.

The gate region 14 is preferably formed of an electrically conductive material, such as highly doped polysilicon. The gate region 14 preferably overlies an electrically nonconductive gate insulation layer 15, which is preferably a silicon oxide, such as silicon dioxide. The integrated circuit 12 also preferably includes a well 18 and isolation structures 20. Electrically nonconductive spacers 22 preferably further isolate the gate region 14 from the surrounding structures of the integrated circuit 12.

Figure 2:
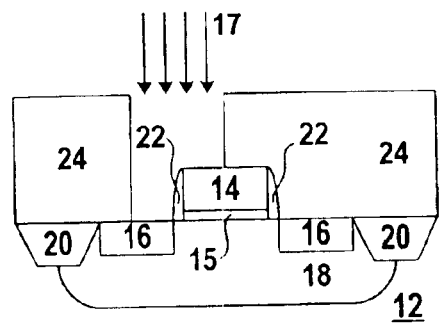
FIG. 2 is a cross-sectional side view of the integrated circuit receiving an implant through a patterned layer of photoresist.

Referring now to FIG. 2, a layer 24 of photoresist is applied to the integrated circuit 12 and patterned using a photoresist mask, such that selective portions of the integrated circuit 12 remain exposed. More particularly, the layer 24 of photoresist is patterned so that at least a portion of the source drain region 16 and at least a portion of the gate region 14 each remain uncovered by the layer 24 of photoresist. The exposed portions of the source drain region 16, the gate region 14, and the electrically nonconductive spacer 22 define the area where the local interconnect is to be formed.

According to the first embodiment of the invention, a precursor species 17 is implanted in the integrated circuit 12. The implantation of the precursor species 17 is especially preferred into the exposed portion of the electrically nonconductive spacer 22, for reasons as described in more detail below. However, the integrated circuit is not harmed by the implantation of the precursor species 17 in the source drain region 16 or the gate region 14. In alternate embodiments, the layer of photoresist 24 is patterned so that only the electrically nonconductive spacer 22 in the area between the gate region 14 and the source drain region 16 is exposed and receives the implantation of the precursor species 17. Layer 24 could be used to shield spacer oxide so the implant species is across the majority of the area. This is done to even out the silicide thickness across the source drain and gate regions.

Preferably, the precursor species 17 is one or more of a semiconducting material such as silicon or germanium. Most preferably, the precursor species 17 is selected based at least in part upon the semiconductor material used to form the integrated circuit 12. For example, if the integrated circuit is formed of silicon, then most preferably the precursor species 17 is silicon. On the other hand, if the integrated circuit 12 is formed of germanium, then the precursor species 17 is most preferably germanium. It is appreciated that other semiconducting materials are also contemplated by the present invention, including III–V compounds such as gallium arsenide. It is also appreciated that the precursor species 17 need not be the same material as that upon which the integrated circuit 12 is based. For example, in an alternate embodiment the integrated circuit 12 is based on silicon and the precursor species 17 is germanium. However, when the material of the precursor species 17 matches the material upon which the integrated circuit 12, is based, there may be fewer interactions and other effects to be provided for in the design and processing of the integrated circuit 12. In a most preferred embodiment, the precursor species 17 is selected so as to not fundamentally or substantially change the functional properties of either the source drain region 16 or the gate region 14.

In a most preferred embodiment, where the integrated circuit 12 is based on silicon technology and the precursor species 17 is silicon, the precursor species 17 is implanted with an energy of between about two thousand electron volts and about one hundred and twenty thousand electron volts, and most preferably about twenty thousand electron volts. Preferably the silicon is implanted at an implant dosage of between about $10^{20}$ ions per square centimeter and about $10^{26}$ ions per square centimeter, and most preferably at about $10^{22}$ ions per square centimeter. By using the preferred implantation energy and dosage, a shallow bond breaking implantation causing disorder to the silicon dioxide network is preferably attained. The implantation of the precursor species 17 within the exposed electrically nonconductive spacer 22 creates a surface layer of the electrically nonconductive spacer 22 that is rich in the precursor species 17. For example, in an embodiment where the electrically non conductive spacer 22 is silicon oxide and the precursor species 17 is silicon, the implantation of the silicon 17 into the silicon oxide spacer creates a surface layer that is rich in silicon.

Figure 3:
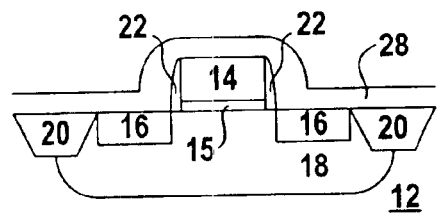
FIG. 3 is a cross-sectional side view of the integrated circuit with a layer of a reactive metal.

Once the precursor species 17 is implanted through the exposed portions of the layer of photoresist 24, the layer of photoresist 24 is removed. As shown in FIG. 3, a metal layer 28 is deposited over the integrated circuit 12. The metal layer 28 is preferably formed of a metal that reacts with the precursor species 17 to form a conductive material that is resistant to a process in which the unreacted metal layer 28 is removed from the integrated circuit 12 and the reacted portion of the metal layer 28 remains on the integrated circuit 12. In a most preferred embodiment the metal layer 28 is cobalt and the precursor species 17 is silicon. With this combination, there is sufficient silicon within the surface layer 26 of the electrically nonconductive spacer 22 to form a silicide with the cobalt metal layer 28 that overlies the electrically nonconductive spacer 22 when the integrated circuit 12 is heated. Other materials that are suitable for use as the metal layer 28 include titanium, nickel, tungsten, and platinum.

Figure 4:
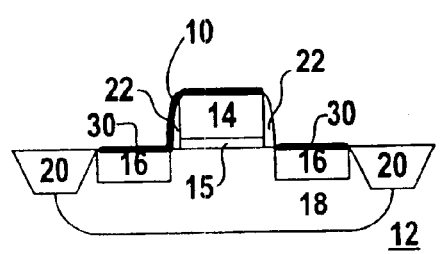
FIG. 4 is a cross-sectional side view of the-integrated circuit after the formation of a local interconnect, in accordance with a first embodiment of the invention.

A rapid thermal annealing process is most preferably used to create the silicide layer 30 as depicted in FIG. 4, where a portion of the silicide layer 30 forms a local interconnect 10 between the source drain region 16 and the gate region 14. It is appreciated that depositing the metal layer 28 and forming a silicide layer 30 is often desired for forming ohmic electrical contacts at the surface of the source drain regions 16 and the surface of the gate region 14. Therefore, the formation of the silicide local interconnect 10 does not require that extra steps such as depositing the metal layer 28 and forming the silicide layer 30 be performed. Only the additional steps of patterning the photoresist layer 24 and implanting the precursor species 17 are required to form the local interconnect 10.

In a standard process, the electrically nonconductive spacer 22 would not contain a sufficient amount of available silicon or other precursor material to react with the metal layer 28 to form a silicide under standard processing conditions. Thus, when the unreacted metal layer 28 is stripped from the integrated circuit 12, the metal layer 28 overlying the electrically nonconductive spacer 22 would not be reacted, and would also be removed from the integrated circuit 12. Thus, in typical processing where the precursor species 17 is not impregnated into the electrically nonconductive spacer 22, a local interconnect 10 is not formed during the silicide formation process. However, by increasing the content of the precursor species 17 in the electrically nonconductive spacer 22, a sufficient amount of the precursor species is available to form the silicide local interconnect 10.

Unreacted portions of the metal layer 28 are stripped, such as in a wet etch process. Thus, those portions of the electrically nonconductive spacer 22 that were protected by the photoresist layer 24 during implantation of the precursor species 17 do not form a silicide layer during the anneal. Accordingly, the gate region 14 is electrically isolated from the other source drain region 16, depicted on the right side of FIG. 4. The integrated circuit 12 preferably receives further processing to complete the transistor as desired.

Figure 5:
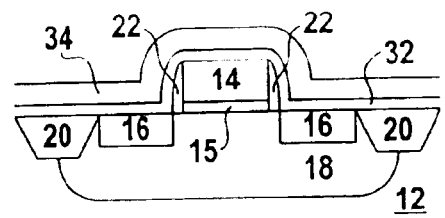
FIG. 5 is a cross-sectional side view of an integrated circuit with a silicon layer, in accordance with a second embodiment of the invention.

Referring now to FIGS. 5–8, a second embodiment of the invention is described. As described above in accordance with the first embodiment of the invention, the integrated circuit 12 is processed through formation of the electrically nonconductive spacers 22. As depicted in FIG. 5, a layer of a first etch selective material 32 is deposited on the integrated circuit 12. Most preferably the first etch selective material 32 is a silicon oxide, such as silicon dioxide. A layer of a second etch selective material 34 is deposited on top of the first etch selective material 32. Most preferably the second etch selective material 34 is polysilicon or amorphous silicon. The considerations involved in the selection of the materials for the first etch selective material 32 and the second etch selective material 34 are described in more detail below.

Figure 6:
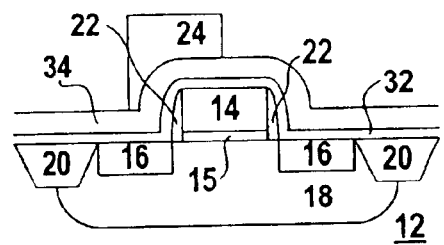
FIG. 6 is a cross-sectional side view of the integrated circuit of FIG. 5 after the application of a layer of photoresist.

A layer of photoresist 24 is applied on top of the layer of the second etch selective material 34. The layer of photoresist 24 is patterned such that selected portions of the integrated circuit 12 remain exposed, as depicted in FIG. 6. Preferably, the layer 24 of photoresist is patterned so that a portion of each of the first etch selective material 32 and the second etch selective material 34 remains covered by the layer of photoresist 24. The covered portions of the first etch selective material 32 and the second etch selective material 34 preferably overlie a portion of the source drain region 16, a portion of the gate region 14, and a portion of the electrically nonconductive spacer 22 disposed between the source drain region 16 and the gate region 14. The covered portions of the source drain region 16, the gate region 14 and electrically nonconductive spacer 22 preferably define the area where the local interconnect 10 is to be formed.

The second etch selective material 34 is preferably etched using a standard wet or dry etch process. The etch process used is most preferably selective between the first etch selective material 32 and the second etch selective material 34, such that the etch process removes the exposed portions of the second etch selective material 34 but does not remove significant amounts of the first etch selective material 32. The first etch selective material 32 is then preferably etched using a standard wet or dry etch process. The etch process used is most preferably selective between the first etch selective material 32 and the material of the integrated circuit 12 which it overlies. Thus, the first etch selective material 32 and the second etch selective material 34 are preferable selected so as to be selectively etchable, where etch processes can be selected which selectively etch one but not both of the layers, and where etching the first etch selective material 32 does not appreciably etch the material in which the integrated circuit 12 is formed.

For example, in a preferred embodiment in which the integrated circuit 12 is formed in silicon, the first etch selective material 32 is preferably a silicon oxide, such as silicon dioxide, and the second etch selective material 34 is preferably polysilicon or amorphous silicon. Most preferably, the material of the second etch selective material 34 is also selected so as to have other properties, as explained in more detail below. The layer of photoresist 24 is preferably removed when the first etch selective material 32 and the second etch selective material 34 have been etched.

Figure 7:
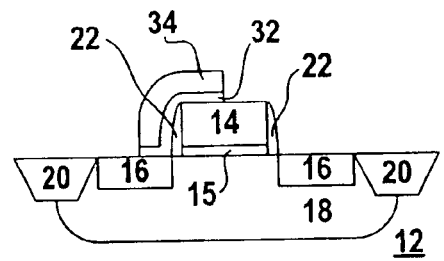
FIG. 7 is a cross-sectional side view of the integrated circuit of FIG. 6 after etching the silicon layer.
Figure 8:
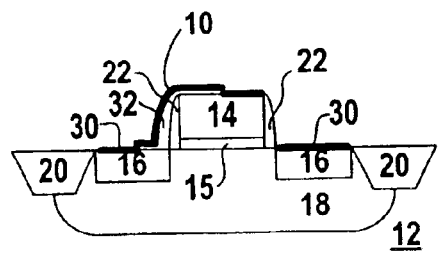
FIG. 8 is a cross-sectional side view of the integrated circuit of FIG. 7 with a local interconnect in accordance with the second embodiment of the invention.

As shown in FIG. 7, a portion of the first etch selective material 32 and the second etch selective material 34 remain after the photoresist layer 24 is removed, which portion defines the area for forming the local interconnect 10. A layer of a metal, such as cobalt, is preferably deposited over the integrated circuit 12, and reacted to form a silicide layer 30, as depicted in FIG. 8. The silicide layer 30 is formed by the reaction between the deposited metal and the second etch selective material 34, source drain regions 16, and gate region 14. As shown in FIG. 8, the silicide layer 30 encompasses a portion of the electrically nonconductive spacer 22, forming an electrical connection between the source drain region 16 and the gate region 14 of the integrated circuit 12. Unreacted metal is removed using a standard wet or dry etch process.

Thus, the second etch selective material 34 is preferably a precursor material that reacts with the metal to form a silicide, or other material having the conductive properties and etch selectivity as described above. In a most preferred embodiment, the second etch selective material 34 is a semiconducting material, such as one or more of either polysilicon or amorphous silicon, so that a silicide local interconnect 10 is formed when the metal layer is reacted with the second etch selective material 34.

The electrically nonconductive spacer 22 that was not protected by the photoresist when the second etch selective material 34 and the first etch selective material 32 were etched, does not have an overlying silicide layer 30, and accordingly the gate region 14 is electrically isolated from the source drain region 16 on the right side of FIG. 8. In accordance with the second embodiment of the invention, the silicide layer 30 forms the local interconnect 10 between the source drain region 16 on the left and the gate region 14 of the integrated circuit 12. Again, it is appreciated that once the local interconnect 10 is formed, further processing steps are performed to fashion the other desired elements of the integrated circuit 12.

Figure 9:
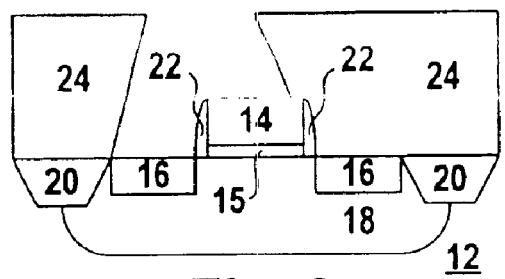
FIG. 9 is a cross-sectional side view of an integrated circuit after the application of a layer of photoresist, in accordance with a third embodiment of the invention.

Referring now to FIGS. 9–13, a third embodiment of the invention is described. Again, for ease of explaining the particulars of the invention, the integrated circuit 12 has been fabricated through formation of the electrically nonconductive spacers 22. As shown in FIG. 9, a layer of photoresist 24 is applied to the integrated circuit 12. A photolithography process is used to define a negative sloped image in the layer of photoresist 24. The photolithography process preferably utilizes a process such as a positive depth of focus setting to focus the image deeper in the layer of photoresist 24. As a result, a negative taper is defined in the layer of photoresist 24. The negative taper serves to expose portions of the source drain region 16 and the gate region 14.

Figure 10:
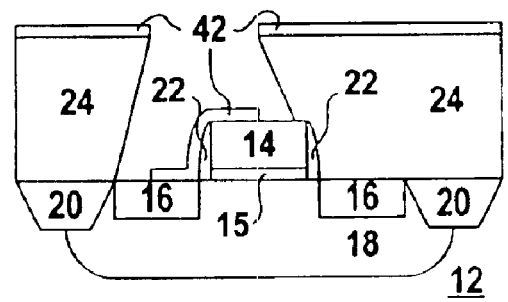
FIG. 10 is a cross-sectional side view of the integrated circuit of FIG. 9 with a layer of material.

As depicted in FIG. 10, a layer 42 of either a metal or a precursor such as doped silicon is deposited over the integrated circuit 12. It is preferred to use a deposition process that is relatively highly directional and not conformal, such as sputtering or ion milling. An electroplating procedure may be used to deposit metal across the open region on top of a layer of doped silicon 42. The negative taper of the photoresist layer 24 substantially prevents deposition of the layer 42 onto the sidewalls of the layer 24 of photoresist.

Figure 11:
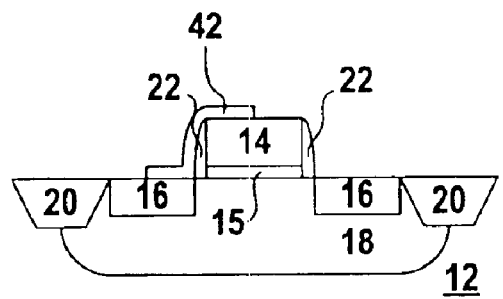
FIG. 11 is a cross-sectional side view of the integrated circuit of FIG. 10 with the layer of photoresist and a portion of the layer of material removed.

The layer 42 is preferably removed from the layer 24 of photoresist, such as by a chemical mechanical polish or a lift off process. If the layer of photoresist 24 is not removed in the process by which the portions of the layer 42 overlying the photoresist 24 are removed, then the photoresist 24 is separately removed from the integrated circuit 12. As shown in FIG. 11, the remaining layer 42 of either metal or doped silicon defines the location for the formation of the local interconnect 10.

Figure 12:
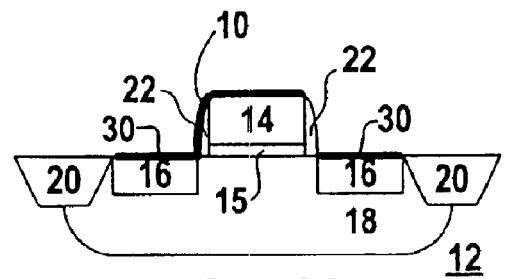
FIG. 12 is a cross-sectional side view of the integrated circuit of FIG. 11 with a local interconnect in accordance with the third embodiment of the invention.

A layer 46 (not shown in figures) of a metal, such as cobalt, is deposited over the integrated circuit 12, and reacted such as with a rapid thermal annealing process to create the local interconnect 10, as depicted in FIG. 12. When the layer 42 is metal, an alloyed material results from the process. The alloyed material defines the local interconnect 10. When the layer 42 is doped silicon, a layer of silicide is formed in the process, which defines the local interconnect 10. Any unreacted metal is then removed using a standard wet or dry etch process. The reacted metal, whether it be silicide or an alloy, preferably has a slower etch rate than the unreacted metal, and thus is left behind as the local interconnect 10 after the etch process. Again, it is appreciated that once the local interconnect 10 is formed, further processing steps may selectively be used to form elements of the integrated circuit 12.

Various specific materials have been recited in the embodiments described above. It is appreciated that other materials that are compatible with the materials, processes, and functions as described herein could also be used, and that the invention is not to be limited to any one specific combination of materials.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of forming a local interconnect between a gate region and a source drain region of an integrated circuit, where the gate region and the source drain region are separated by an electrically nonconductive spacer, the method comprising the steps of:

patterning the integrated circuit with a layer of photoresist, where the layer of photoresist covers portions of the integrated circuit where the local interconnect is not to be formed, depositing a layer of reactive material through the patterned layer of photoresist, removing the layer of photoresist, depositing a layer of metal over the integrated circuit, heating the integrated circuit to form a reacted local interconnect from the metal layer and the layer of reactive material, and removing any of the metal layer that does not form the reacted local interconnect in the heating step.

2. The method of claim 1, wherein the patterned layer of photoresist has sidewalls with a negative slope.

3. The method of claim 1, wherein the step of depositing a layer of metal comprises depositing the layer of metal by electroplating.

4. A method of forming a local interconnect between a gate region and a source drain region of an integrated circuit, where the gate region and the source drain region are separated by an electrically nonconductive spacer, the method comprising the steps of:

patterning the integrated circuit with a layer of photoresist, where the layer of photoresist covers portions of the integrated circuit where the local interconnect is not to be formed, depositing a first layer of metal through the patterned layer of photoresist, removing the layer of photoresist, depositing a second layer of metal over the integrated circuit, heating the integrated circuit to form an alloyed local interconnect from the first layer of metal and the second layer of metal, and removing any of the first and second metal layers that do not form the local interconnect in the heating step.

5. The method of claim 4, wherein the patterned layer of photoresist has sidewalls with a negative slope.

\* \* \* \* \*